(12) United States Patent
Honda et al.

(10) Patent No.: US 11,817,837 B2
(45) Date of Patent: Nov. 14, 2023

(54) POWER AMPLIFIER CIRCUIT

(71) Applicant: Murata Manufacturing Co., Ltd., Kyoto (JP)

(72) Inventors: Yuri Honda, Kyoto (JP); Satoshi Tanaka, Kyoto (JP); Yasuhisa Yamamoto, Kyoto (JP); Hiroki Shonai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 164 days.

(21) Appl. No.: 17/129,041

(22) Filed: Dec. 21, 2020

(65) Prior Publication Data
US 2021/0203289 A1 Jul. 1, 2021

(30) Foreign Application Priority Data

Dec. 25, 2019 (JP) ................................ 2019-234496

(51) Int. Cl.
*H03F 3/45* (2006.01)
*H03F 3/24* (2006.01)
*H03F 3/195* (2006.01)

(52) U.S. Cl.
CPC ............ *H03F 3/245* (2013.01); *H03F 3/195* (2013.01); *H03F 2200/102* (2013.01); *H03F 2200/171* (2013.01); *H03F 2200/451* (2013.01); *H03F 2200/537* (2013.01)

(58) Field of Classification Search
CPC .......................... H03F 3/45; H03F 2200/181
USPC ...................................... 330/165, 276, 252
See application file for complete search history.

(56) References Cited

U.S. PATENT DOCUMENTS

| | | | |
|---|---|---|---|
| 9,584,076 B2 | 2/2017 | Ortiz | |
| 10,797,657 B2* | 10/2020 | Takenaka | ............ H03F 3/45085 |
| 2012/0235746 A1* | 9/2012 | Li | ............ H03F 3/193 |
| | | | 330/296 |
| 2022/0189936 A1* | 6/2022 | Tsutsui | ............ H01L 24/08 |

* cited by examiner

*Primary Examiner* — Henry Choe
(74) *Attorney, Agent, or Firm* — Pearne & Gordon LLP

(57) ABSTRACT

A power amplifier circuit has an input node from which an input signal, which is a high-frequency signal, is inputted and an output node to which the input signal is amplified by a differential amplifier circuit to be outputted as an output signal. The power amplifier circuit includes a balun transformer (second balun transformer) including an input-side winding that has a substantially center to which a power-supply voltage is supplied and that is connected between differential outputs of the differential amplifier circuit, and an output-side winding that is coupled to the input-side winding via an electromagnetic field and that has one end connected to a reference potential; and a capacitive element (capacitor) provided between another end (node) of the output-side winding and the output node.

10 Claims, 15 Drawing Sheets

FREQUENCY:10 [MHz]~8.5 [GHz]

FREQUENCY :10 [MHz]~8.5 [GHz]

FREQUENCY:10 [MHz]~8.5 [GHz]

POWER AMPLIFIER CIRCUIT

CROSS REFERENCE TO RELATED APPLICATION

This application claims priority from Japanese Patent Application No. 2019-234496 filed on Dec. 25, 2019. The content of this application is incorporated herein by reference in its entirety.

BACKGROUND OF THE DISCLOSURE

Field of the Disclosure

The present disclosure relates to a power amplifier circuit.

Description of the Related Art

In radio communication systems in mobile communication terminal devices, such as cellular phones and smartphones, modulation schemes for high speed uplink packet access (HSUPA), long term evolution (LTE), and so forth are adopted. In a fourth generation mobile communication system, multiband carrier waves are increasingly achieved, and support for multiple frequency bands is demanded. Furthermore, to achieve high-speed data communication and stable communication, an increase in bandwidth is attempted by carrier aggregation (CA). For this reason, in a power amplifier circuit as well in a stage preceding a front-end section, support for multiple bands and wider bandwidths is demanded.

U.S. Pat. No. 9,584,076 discloses a power amplifier circuit that subjects an input signal, which is a high-frequency signal, to unbalanced-to-balanced conversion by using a balun transformer (transformer) to convert the input signal to a differential signal, amplifies the differential signal by using a differential amplifier circuit, and subjects the amplified differential signal to balanced-to-unbalanced conversion by using a balun transformer to obtain an output signal. In the power amplifier circuit, a low pass filter is provided in an output matching network to suppress harmonic components to be superimposed on the output signal. Such a configuration makes it possible to achieve output matching over a wide frequency band.

In recent years, there is concern about an increase in power consumption along with migration to a fifth generation mobile communication system. As a technique for increased efficiency to increase power efficiency, there are an envelope tracking (ET) scheme in which a power-supply voltage of a power amplifier is controlled in accordance with an amplitude level of an input signal, and an average power tracking (APT) scheme in which a power-supply voltage of a power amplifier is controlled in accordance with average output power. In the differential amplification-type power amplifier circuit disclosed in U.S. Pat. No. 9,584,076, there is a possibility that a frequency component lower in frequency than a high-frequency signal (for example, a frequency component in a low frequency band including 100 MHz) is superimposed on an output signal due to a distortion component of the differential amplifier circuit.

BRIEF SUMMARY OF THE DISCLOSURE

The present disclosure has been made in view of the above to keep, in a differential amplification-type power amplifier circuit, a frequency component lower in frequency than a high-frequency signal from being superimposed on an output signal due to a distortion component of a differential amplifier circuit.

A power amplifier circuit according to one aspect of the present disclosure is a power amplifier circuit having an input node from which a high-frequency signal is inputted and an output node to which the high-frequency signal is amplified by a differential amplifier circuit to be outputted. The power amplifier circuit includes a balun transformer including an input-side winding that has a substantially center to which a power-supply voltage is supplied and that is connected between differential outputs of the differential amplifier circuit, and an output-side winding that is coupled to the input-side winding via an electromagnetic field and that has one end connected to a reference potential; and a capacitive element provided between another end of the output-side winding and the output node.

In this configuration, the capacitive element is provided in an output path of the high-frequency signal in the differential amplification-type power amplifier circuit, thereby making it possible to keep a frequency component lower in frequency than the high-frequency signal from being superimposed on an output signal due to a distortion component of the differential amplifier circuit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

A power amplifier circuit according to an embodiment will be described in detail below with reference to the drawings. Note that the present disclosure is not to be limited by this embodiment. Each embodiment is illustrative, and it goes without saying that configurations described in different embodiments can be partially replaced or combined. In the embodiment, a description of things that differ slightly from each other and are in common with another configuration is omitted, and only the points at which the embodiment differs from the other configuration will be described. In particular, similar function effects achieved by similar configurations are not described one by one for each configuration.

Figure 1:
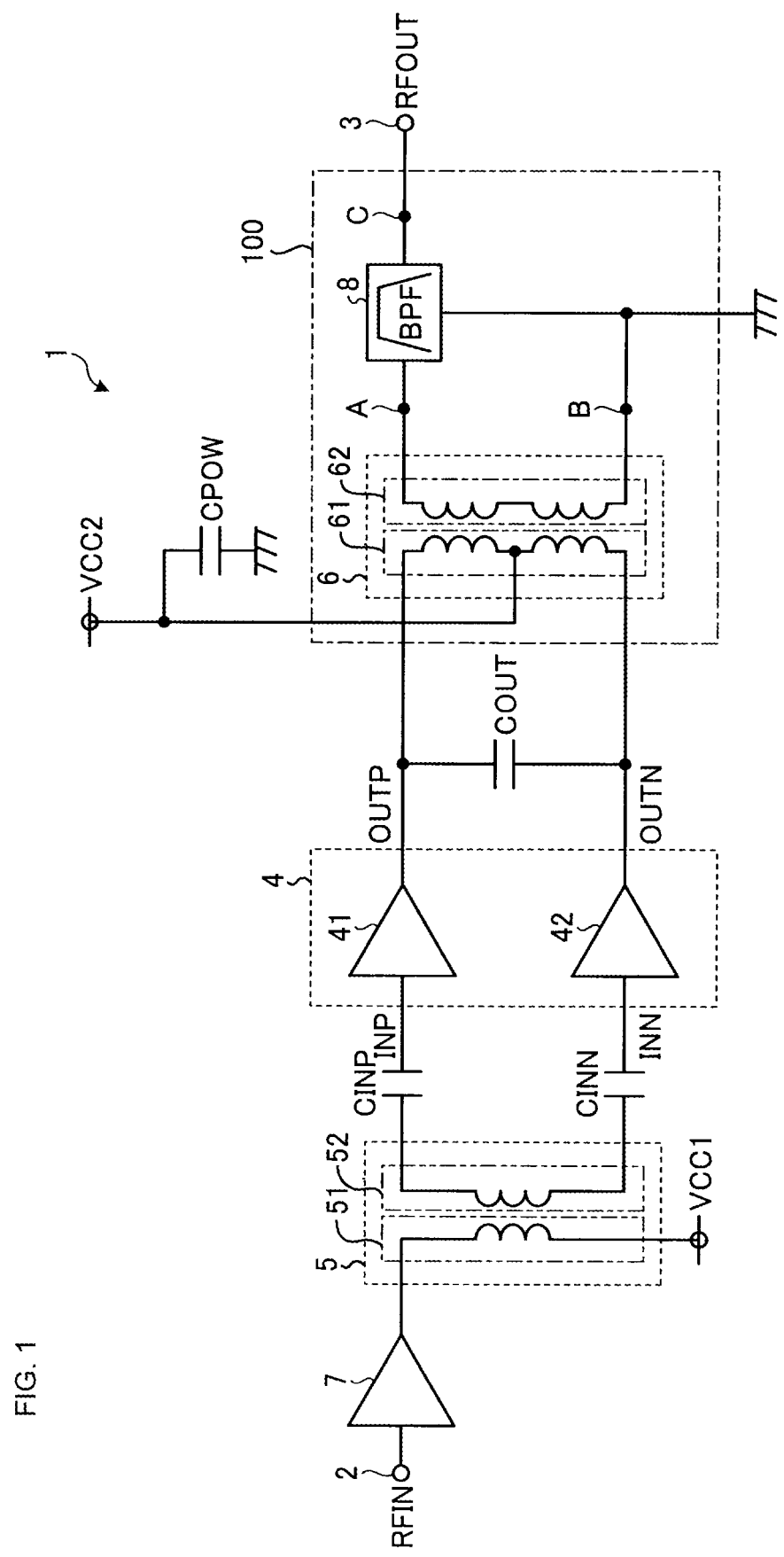
FIG. 1 illustrates a first configuration example of a power amplifier circuit according to an embodiment.
Figure 2:
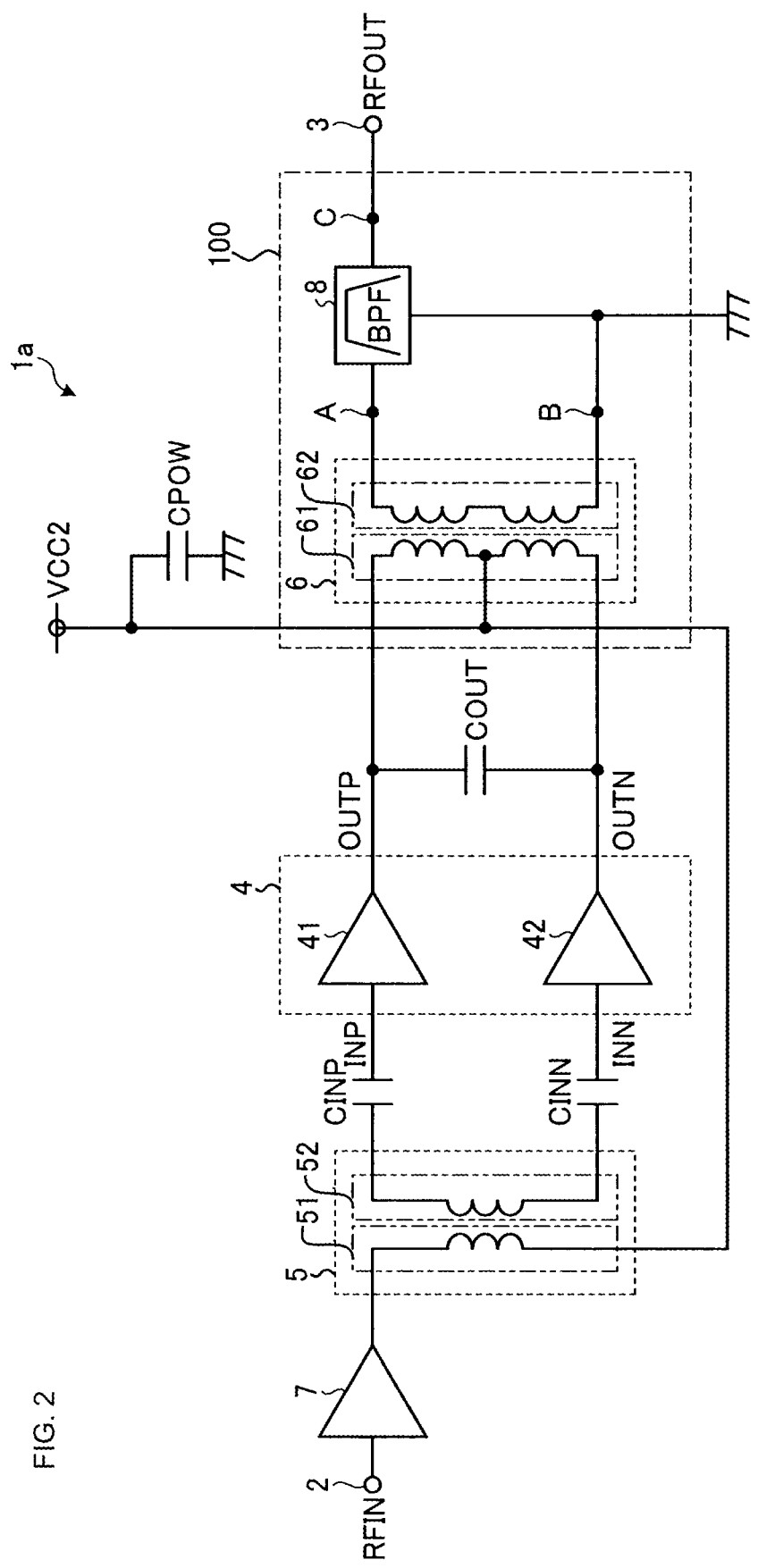
FIG. 2 illustrates a second configuration example of the power amplifier circuit according to the embodiment.

FIG. 1 illustrates a first configuration example of a power amplifier circuit according to an embodiment. FIG. 2 illustrates a second configuration example of the power amplifier circuit according to the embodiment. A power amplifier circuit 1 can be used in a mobile communication terminal device, such as a cellular phone or smartphone, to transmit various signals, such as voice and data, to a base station.

The power amplifier circuit 1 amplifies an input signal RFIN, which is a high-frequency signal, inputted from a preceding circuit to an input node 2. Then, the power amplifier circuit 1 outputs an output signal RFOUT, which is an amplified high-frequency signal, from an output node 3 to a subsequent circuit. Although an example of the preceding circuit is a transmission power control circuit that adjusts power of a modulated signal, the preceding circuit is not limited to this. Although an example of the subsequent circuit is a front-end circuit that subjects the output signal RFOUT to filtering and so forth and transmits the signal to an antenna, the subsequent circuit is not limited to this. Although an example of the frequency of a fundamental (carrier wave) of a high-frequency signal ranges from about several hundred MHz to about several GHz, the frequency is not limited to this.

As illustrated in FIGS. 1 and 2, each of power amplifier circuits 1 and 1a includes a differential amplifier circuit 4 serving as a power-stage amplifier circuit, a first balun transformer 5, a second balun transformer 6, a drive-stage amplifier circuit 7, and a band pass filter 8 (hereinafter also referred to as "BPF 8").

The first balun transformer 5 subjects a high-frequency signal from the drive-stage amplifier circuit 7 to unbalanced-to-balanced conversion to convert the high-frequency signal to a differential signal.

The first balun transformer 5 includes an input-side winding 51 and an output-side winding 52.

In the first configuration example illustrated in FIG. 1, a power-supply voltage VCC1 is applied to one end of the input-side winding 51. The other end of the input-side winding 51 is connected to an output of the drive-stage amplifier circuit 7. Although an example of the power-supply voltage VCC1 may be a power-supply voltage used when the drive-stage amplifier circuit 7 performs power amplification by using an average power tracking (APT) scheme, or may be a power-supply voltage used when the drive-stage amplifier circuit 7 performs power amplification by using an envelope tracking (ET) scheme, the power-supply voltage VCC1 is not limited to these. In other words, the present disclosure is not to be limited by a driving scheme of the drive-stage amplifier circuit 7. Incidentally, the potential of the one end of the input-side winding 51 may be a ground potential. In this case, an additional terminal for connecting the power-supply voltage VCC1 is necessary in the drive stage.

Furthermore, in the second configuration example illustrated in FIG. 2, a power-supply voltage VCC2 is inputted to the one end of the input-side winding 51. The other end of the input-side winding 51 is connected to the output of the drive-stage amplifier circuit 7. Although an example of the power-supply voltage VCC2 may be a power-supply voltage used when the drive-stage amplifier circuit 7 performs power amplification by using the average power tracking (APT) scheme, or may be a power-supply voltage used when the drive-stage amplifier circuit 7 performs power amplification by using the envelope tracking (ET) scheme, the power-supply voltage VCC2 is not limited to these. In other words, the present disclosure is not to be limited by a driving scheme of the drive-stage amplifier circuit 7. Incidentally, the potential of the one end of the input-side winding 51 may be a ground potential. In this case, an additional terminal for connecting the power-supply voltage VCC2 is necessary in the drive stage.

The output-side winding 52 is connected between inputs INP and INN of the differential amplifier circuit 4 through input capacitors CINP and CINN. The output-side winding 52 may be connected between the inputs INP and INN of the differential amplifier circuit 4 without the input capacitors CINP and CINN being provided.

The input-side winding 51 and the output-side winding 52 are coupled via an electromagnetic field. Thus, the input signal RFIN inputted from the drive-stage amplifier circuit 7 to the other end of the input-side winding 51 is subjected to unbalanced-to-balanced conversion by the first balun transformer 5 to be converted to a differential signal, and the differential signal is outputted to the differential amplifier circuit 4.

The second balun transformer 6 subjects the differential signal from the differential amplifier circuit 4 to balanced-to-unbalanced conversion to convert the differential signal to an output signal. The second balun transformer 6 and the BPF 8 constitute an output matching network 100.

The second balun transformer 6 includes an input-side winding 61 and an output-side winding 62.

The input-side winding 61 is connected between an output OUTP and an output OUTN of the differential amplifier circuit 4. At a substantially center of the input-side winding 61, a substantially center tap is provided, and a power-supply voltage VCC2 is applied to this substantially center tap. Although an example of the power-supply voltage VCC2 may be a power-supply voltage used when the differential amplifier circuit 4 performs power amplification by using the average power tracking (APT) scheme, or may be a power-supply voltage used when the differential amplifier circuit 4 performs power amplification by using the envelope tracking (ET) scheme, the power-supply voltage VCC2 is not limited to these. In other words, the present disclosure is not to be limited by a driving scheme of the differential amplifier circuit 4. As used herein, "substantially center" includes up to plus or minus 10% from center.

Furthermore, a capacitor COUT is connected in parallel with the input-side winding 61. The input-side winding 61 and the capacitor COUT constitute a parallel resonant circuit.

One end (node B) of the output-side winding 62 is connected to a reference potential. The other end (node A) of the output-side winding 62 is connected to the output node 3 (node C) through the BPF 8. Although the reference potential is a ground potential herein, the reference potential is not limited to this.

The input-side winding 61 and the output-side winding 62 are coupled via an electromagnetic field. Thus, the differential signal outputted from the differential amplifier circuit 4 is subjected to balanced-to-unbalanced conversion by the second balun transformer 6 to be converted to an output signal RFOUT, and the output signal RFOUT is outputted from the output node 3 through the BPF 8.

The differential amplifier circuit 4 includes two amplifier circuits 41 and 42 that amplify a differential signal. In the present disclosure, the amplifier circuits 41 and 42 operate in class AB or class A to increase efficiency. Each of the amplifier circuits 41 and 42 may be constituted, for example, by a bipolar transistor or by a field effect transistor (FET). In the case where each of the amplifier circuits 41 and 42 is constituted by a bipolar transistor, a heterojunction bipolar transistor (HBT) is given as an example. The present disclosure is not to be limited by the configuration of each of the amplifier circuits 41 and 42.

A capacitor CPOW for noise removal is connected to the substantially center tap of the input-side winding 61, that is, on a power-supply voltage VCC2 supply path extending to the second balun transformer 6. For example, in a configuration in which the differential amplifier circuit 4 performs power amplification by using the average power tracking (APT) scheme, even if a component in a band lower than the band of a high-frequency signal (for example, in a low frequency band including about 100 MHz) is superimposed on an output signal due to distortion components of the two amplifier circuits 41 and 42 of the differential amplifier circuit 4, the distortion components can be attenuated by a capacitance component of the capacitor CPOW.

On the other hand, in a configuration in which the differential amplifier circuit 4 performs power amplification by using the envelope tracking (ET) scheme, an envelope signal in an envelope band (for example, in a low frequency band including about 100 MHz) is supplied to the differential amplifier circuit 4. Thus, when the capacitance component of the capacitor CPOW provided on the power-supply voltage VCC2 supply path is increased, the envelope signal itself is attenuated, resulting in deterioration of distortion characteristics of the differential amplifier circuit 4. For this reason, to begin with, it is difficult to achieve a configuration in which a component in the envelope band (for example, in the low frequency band including about 100 MHz) is attenuated by the capacitor CPOW provided on the power-supply voltage VCC2 supply path.

In the present disclosure, the output matching network 100 includes the BPF 8 that attenuates a component in the envelope band (for example, in the low frequency band including about 100 MHz). This can keep a component in a band lower than the band of a high-frequency signal (for example, in a low frequency band including about 100 MHz) from being superimposed on the output signal RFOUT due to distortion components of the two amplifier circuits 41 and 42 of the differential amplifier circuit 4 while suppressing a harmonic component of the high-frequency signal to be superimposed on the output signal RFOUT.

Figure 3A:
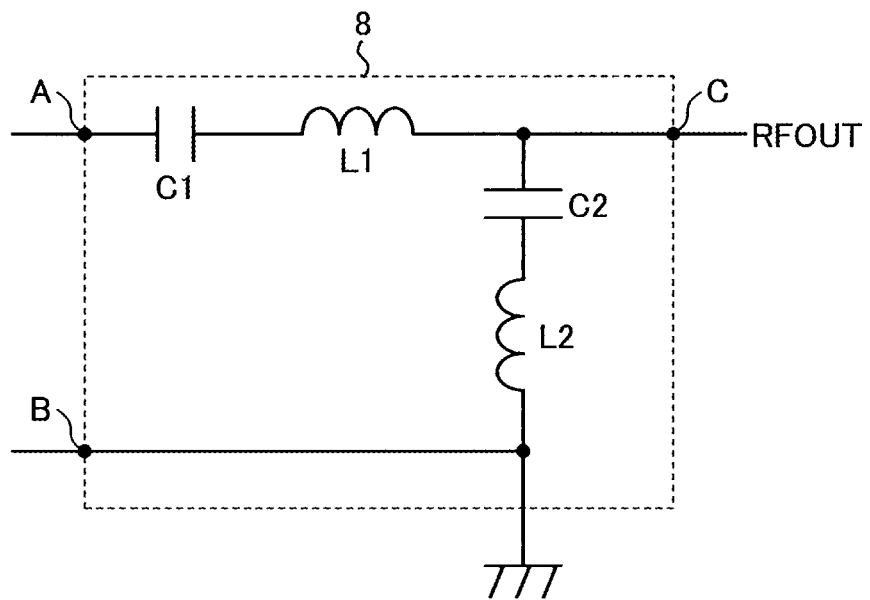
FIG. 3A illustrates a first configuration example of a band pass filter (BPF)
Figure 3B:
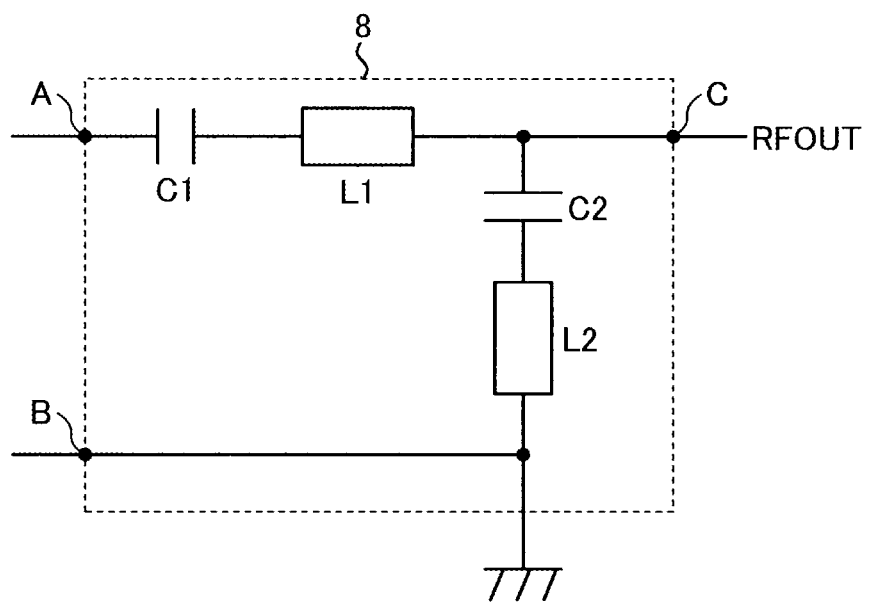
FIG. 3B illustrates a configuration in which an inductance illustrated in FIG. 3A is constituted by a microstrip line.

FIG. 3A illustrates a first configuration example of a band pass filter (BPF). FIG. 3B illustrates a configuration in which an inductance illustrated in FIG. 3A is constituted by a microstrip line.

In the configuration illustrated in FIG. 3A, the BPF 8 includes a capacitor C1 (first capacitive element) and a capacitor C2 (second capacitive element), which are capacitive elements, and an inductor L1 (first inductive element) and an inductor L2 (second inductive element), which are inductive elements. Incidentally, as illustrated in FIG. 3B, the inductors L1 and L2 may be constituted by microstrip lines provided on a dielectric substrate (not illustrated).

In the BPF 8 of the first configuration example illustrated in FIGS. 3A and 3B, the capacitor C1 and the inductor L1 are connected in series with an output path of the output signal RFOUT, that is, between the other end (node A) of the output-side winding 62 and the output node 3 (node C), and the capacitor C2 and the inductor L2 are connected in series between the output node 3 (node C) and the reference potential (node B).

Figure 4:
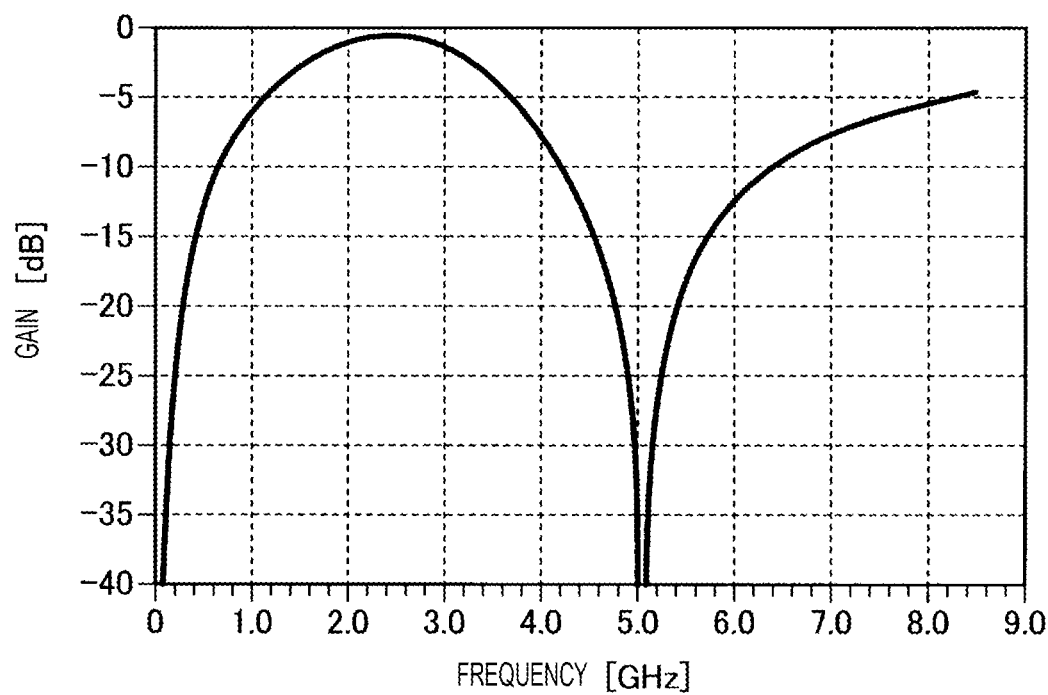
FIG. 4 illustrates an example of simulation results of frequency-gain characteristics in the case where the band pass filter illustrated in FIG. 3A is used in the power amplifier circuit according to the embodiment.
Figure 5:
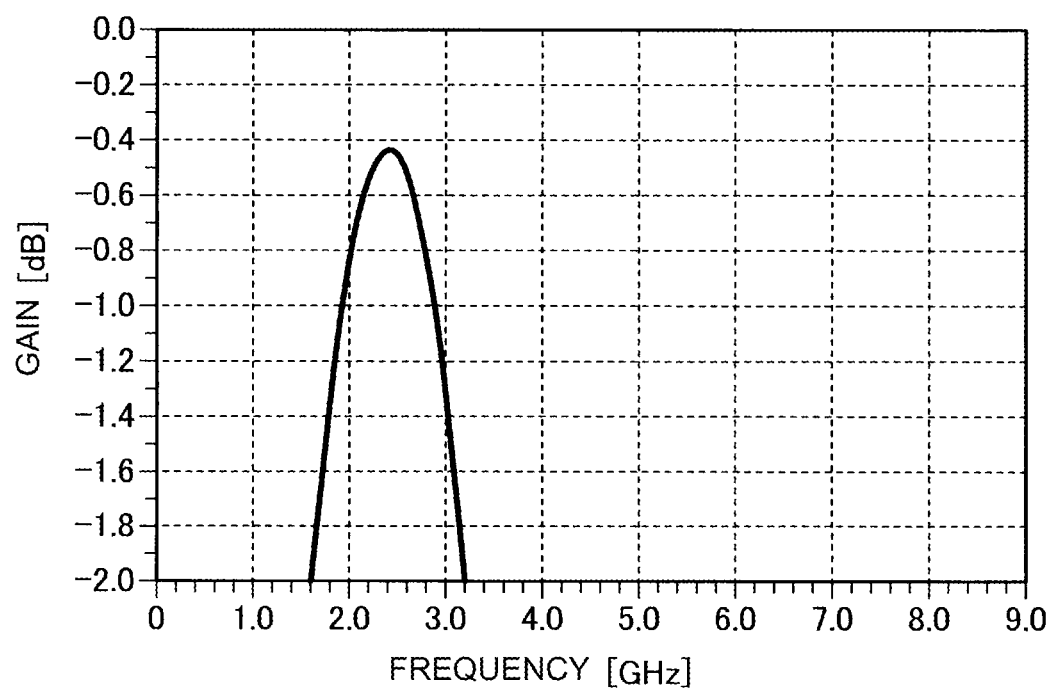
FIG. 5 is an enlarged view of a region of not less than −2.0 dB and not more than 0 dB in the simulation results of the frequency-gain characteristics illustrated in FIG. 4.
Figure 6:
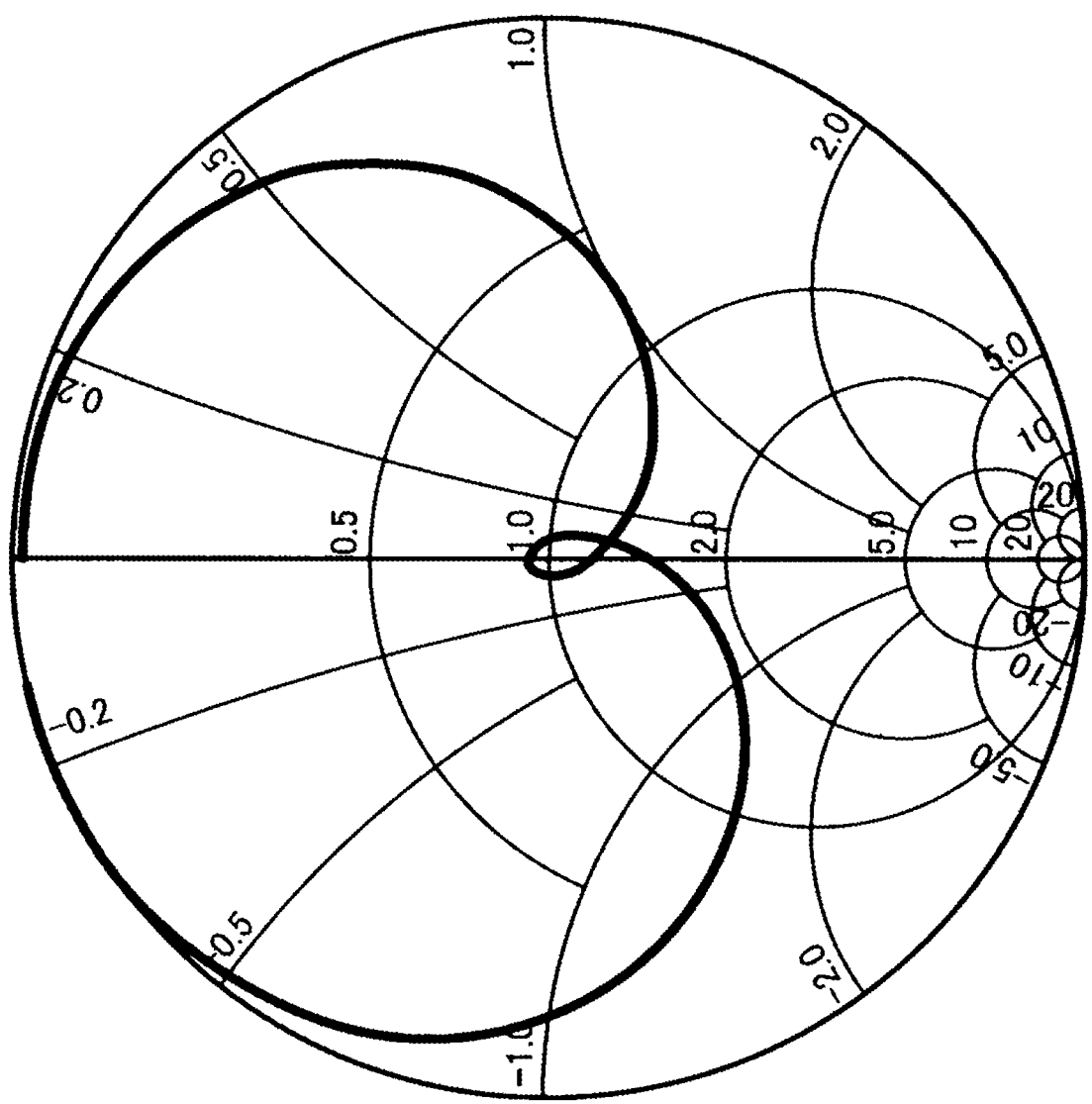
FIG. 6 is a Smith chart illustrating an example of simulation results of load characteristics in the case where the band pass filter illustrated in FIG. 3A is used in the power amplifier circuit according to the embodiment.

FIG. 4 illustrates an example of simulation results of frequency-gain characteristics in the case where the band pass filter illustrated in FIG. 3A is used in the power amplifier circuit according to the embodiment. FIG. 5 is an enlarged view of a region of not less than about −2.0 dB and not more than about 0 dB in the simulation results of the frequency-gain characteristics illustrated in FIG. 4. FIG. 6 is a Smith chart illustrating an example of simulation results of load characteristics in the case where the band pass filter illustrated in FIG. 3A is used in the power amplifier circuit according to the embodiment.

In the example illustrated in FIGS. 4 and 5, the horizontal axis represents frequency, and the vertical axis represents gain. Solid lines indicated in FIGS. 4 and 5 represent a bandpass characteristic from the node A to the node C in the configuration illustrated in FIGS. 3A and 3B.

A solid line indicated in FIG. 6 is a line obtained by plotting load characteristics of the BPF 8 illustrated in FIGS. 3A and 3B in a range of not less than about 10 MHz and not more than about 8.5 GHz.

Each of FIGS. 4, 5, and 6 illustrates results obtained by performing simulations when assuming that the capacitor C1 has a capacitance of about 7 pF, the capacitor C2 has a capacitance of about 2.2 pF, the inductor L1 has an inductance of about 1 nH, and the inductor L2 has an inductance of about 0.45 nH. The component values of the capacitors C1 and C2 and the inductors L1 and L2 are one example, and the present disclosure is not to be limited to the simulation results illustrated in each of FIGS. 4, 5, and 6.

The above-described configuration can keep a component in a band lower than the band of a high-frequency signal (for example, in a low frequency band including about 100 MHz) from being superimposed on the output signal RFOUT due to distortion components of the two amplifier circuits 41 and 42 of the differential amplifier circuit 4 while suppressing a harmonic component of the high-frequency signal to be superimposed on the output signal RFOUT.

Figure 7A:
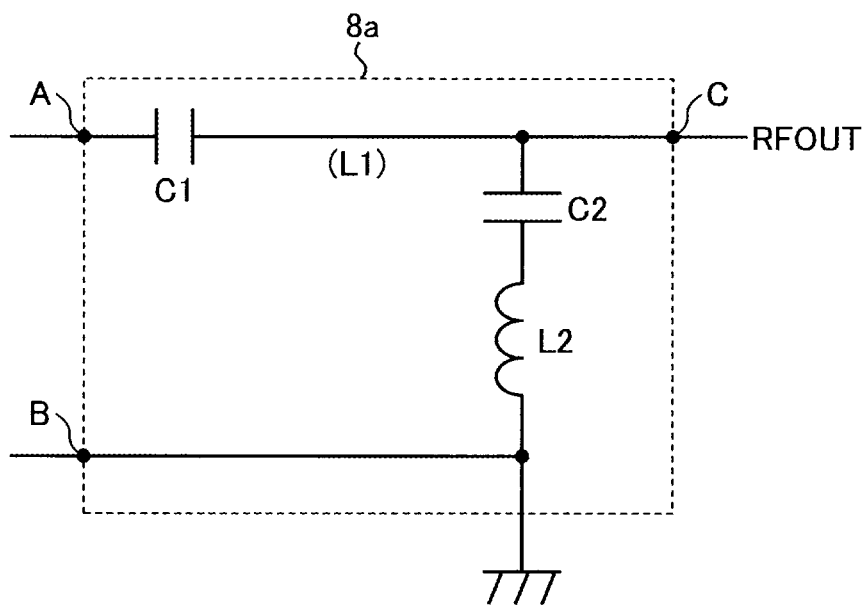
FIG. 7A illustrates a second configuration example of the band pass filter (BPF)
Figure 7B:
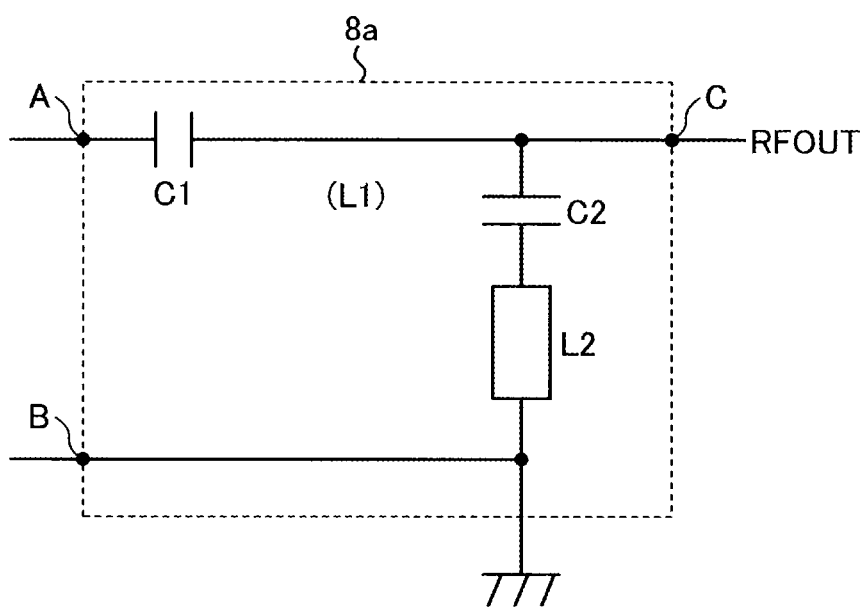
FIG. 7B illustrates a configuration in which an inductance illustrated in FIG. 7A is constituted by a microstrip line.

FIG. 7A illustrates a second configuration example of the band pass filter (BPF). FIG. 7B illustrates a configuration in which an inductance illustrated in FIG. 7A is constituted by a microstrip line.

In the configuration illustrated in FIG. 7A, a BPF 8a includes the capacitor C1 (first capacitive element) and the capacitor C2 (second capacitive element), which are capacitive elements, and the inductor L2 (inductive element), which is an inductive element. In other words, FIG. 7A illustrates the configuration in which the inductor L1 is omitted from the configuration illustrated in FIG. 3A. Incidentally, as illustrated in FIG. 7B, the inductor L2 may be constituted by a microstrip line provided on a dielectric substrate (not illustrated).

In the BPF 8a of the second configuration example illustrated in FIGS. 7A and 7B, the capacitor C1 is connected to the output path of the output signal RFOUT, that is, between the other end (node A) of the output-side winding 62 and the output node 3 (node C), and the capacitor C2 and the inductor L2 are connected in series between the output node 3 (node C) and the reference potential (node B).

Figure 8:
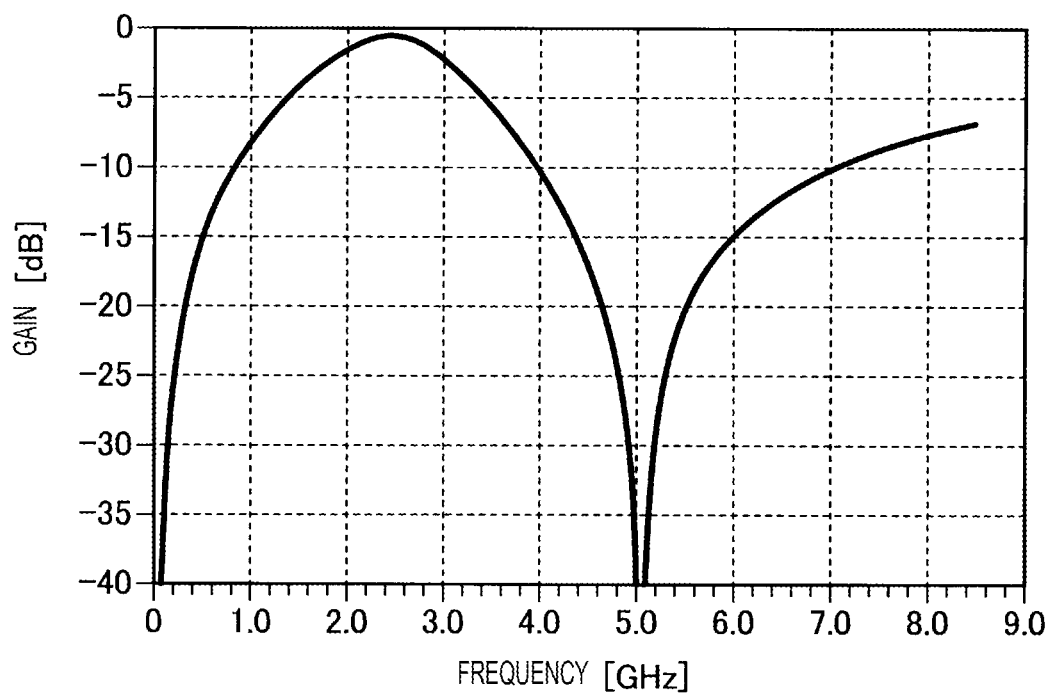
FIG. 8 illustrates an example of simulation results of frequency-gain characteristics in the case where the band pass filter illustrated in FIG. 7A is used in the power amplifier circuit according to the embodiment.
Figure 9:
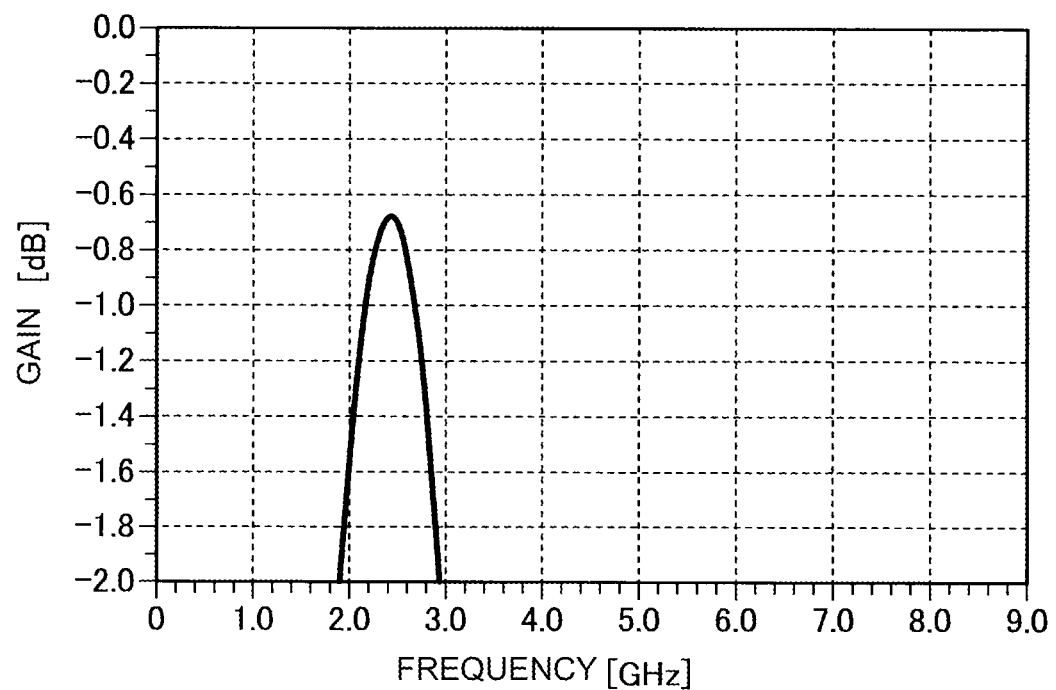
FIG. 9 is an enlarged view of a region of not less than −2.0 dB and not more than 0 dB in the simulation results of the frequency-gain characteristics illustrated in FIG. 8.
Figure 10:
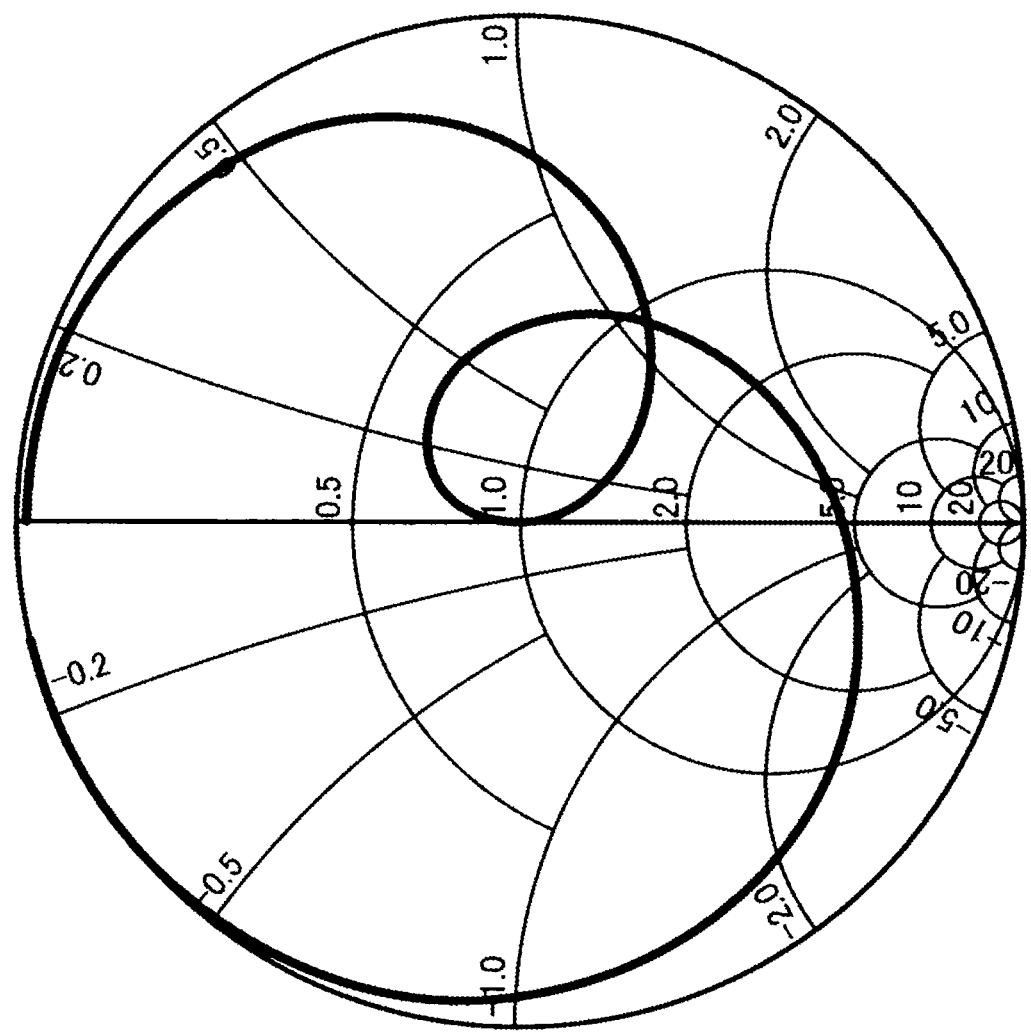
FIG. 10 is a Smith chart illustrating an example of simulation results of load characteristics in the case where the band pass filter illustrated in FIG. 7A is used in the power amplifier circuit according to the embodiment.

FIG. 8 illustrates an example of simulation results of frequency-gain characteristics in the case where the band pass filter illustrated in FIG. 7A is used in the power amplifier circuit according to the embodiment. FIG. 9 is an enlarged view of a region of not less than about −2.0 dB and not more than about 0 dB in the simulation results of the frequency-gain characteristics illustrated in FIG. 8. FIG. 10 is a Smith chart illustrating an example of simulation results of load characteristics in the case where the band pass filter illustrated in FIG. 7A is used in the power amplifier circuit according to the embodiment.

In the example illustrated in FIGS. 8 and 9, the horizontal axis represents frequency, and the vertical axis represents gain. Solid lines indicated in FIGS. 8 and 9 represent a bandpass characteristic from the node A to the node C in the configuration illustrated in FIGS. 7A and 7B.

A solid line indicated in FIG. 10 is a line obtained by plotting load characteristics of the BPF 8a illustrated in FIGS. 7A and 7B in a range of not less than about 10 MHz and not more than about 8.5 GHz.

Each of FIGS. 8, 9, and 10 illustrates results obtained by performing simulations when assuming that the capacitor C1 has a capacitance of about 15 pF, the capacitor C2 has a capacitance of about 4 pF, and the inductor L2 has an inductance of about 0.25 nH. The component values of the capacitors C1 and C2 and the inductor L2 are one example, and the present disclosure is not to be limited to the simulation results illustrated in each of FIGS. 8, 9, and 10.

The above-described configuration can keep a component in a band lower than the band of a high-frequency signal (for example, in a low frequency band including about 100 MHz) from being superimposed on the output signal RFOUT due to distortion components of the two amplifier circuits 41 and 42 of the differential amplifier circuit 4 while suppressing a harmonic component of the high-frequency signal to be superimposed on the output signal RFOUT.

Figure 11A:
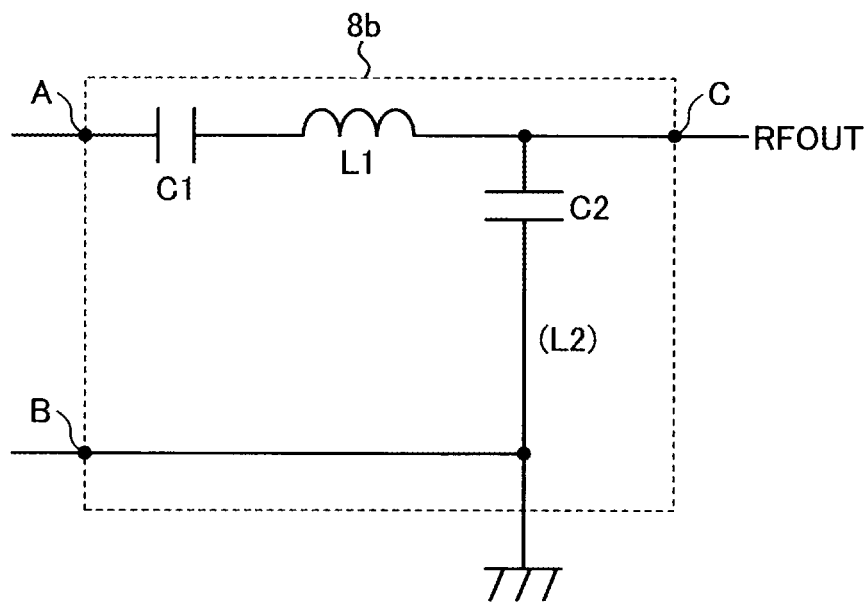
FIG. 11A illustrates a third configuration example of the band pass filter (BPF)
Figure 11B:
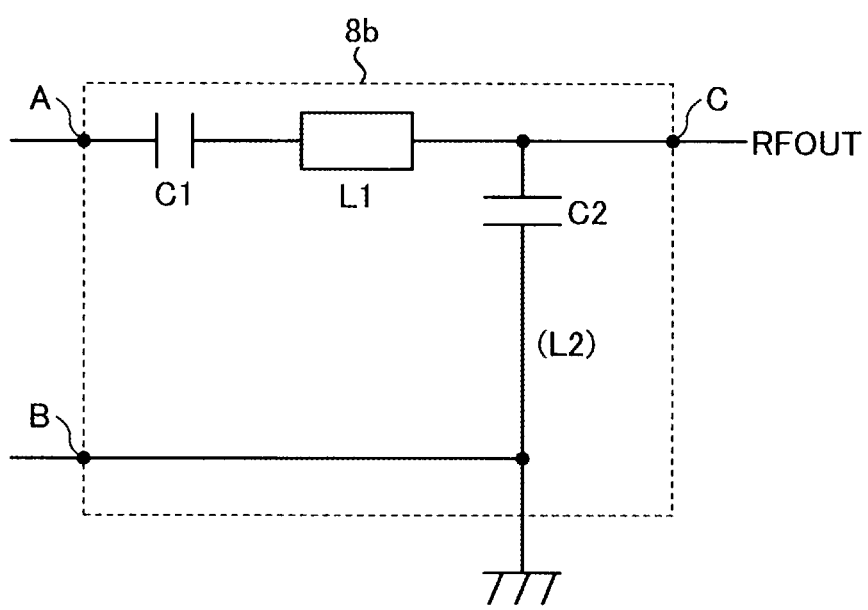
FIG. 11B illustrates a configuration in which an inductance illustrated in FIG. 11A is constituted by a microstrip line.

FIG. 11A illustrates a third configuration example of the band pass filter (BPF). FIG. 11B illustrates a configuration in which an inductance illustrated in FIG. 11A is constituted by a microstrip line.

In the configuration illustrated in FIG. 11A, a BPF 8b includes the capacitor C1 (first capacitive element) and the capacitor C2 (second capacitive element), which are capacitive elements, and the inductor L1 (inductive element), which is an inductive element. In other words, FIG. 11A illustrates the configuration in which the inductor L2 is omitted from the configuration illustrated in FIG. 3A. Incidentally, as illustrated in FIG. 11B, the inductor L1 may be constituted by a microstrip line provided on a dielectric substrate (not illustrated).

In the BPF 8b of the third configuration example illustrated in FIGS. 11A and 11B, the capacitor C1 and the inductor L1 are connected in series with the output path of the output signal RFOUT, that is, between the other end (node A) of the output-side winding 62 and the output node 3 (node C), and the capacitor C2 is connected between the output node 3 (node C) and the reference potential (node B).

Figure 12:
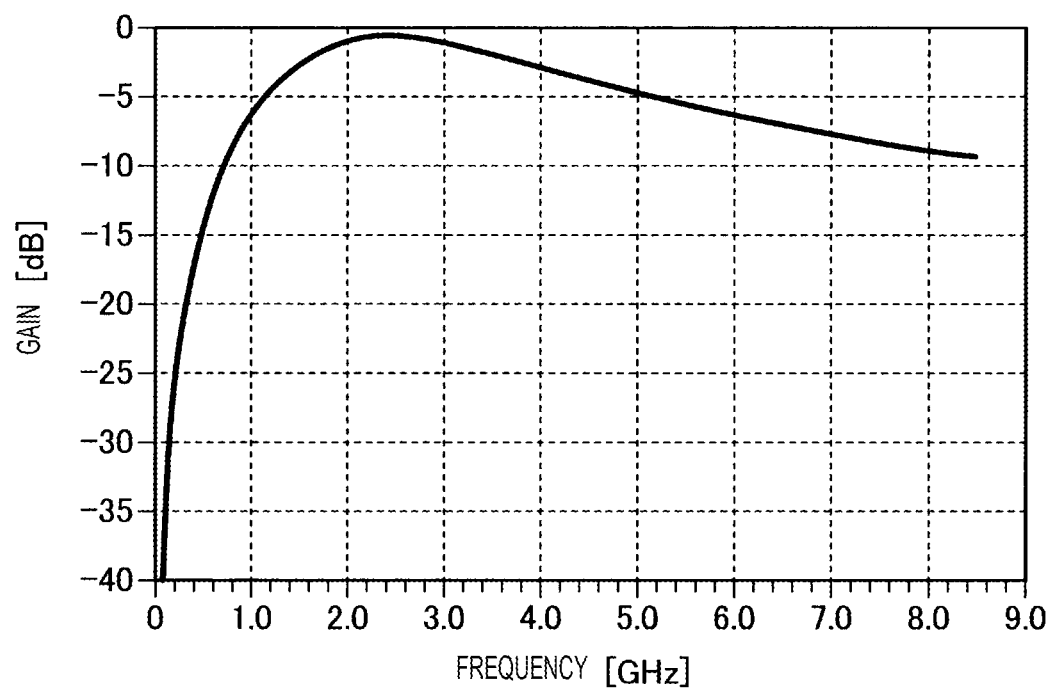
FIG. 12 illustrates an example of simulation results of frequency-gain characteristics in the case where the band pass filter illustrated in FIG. 11A is used in the power amplifier circuit according to the embodiment.
Figure 13:
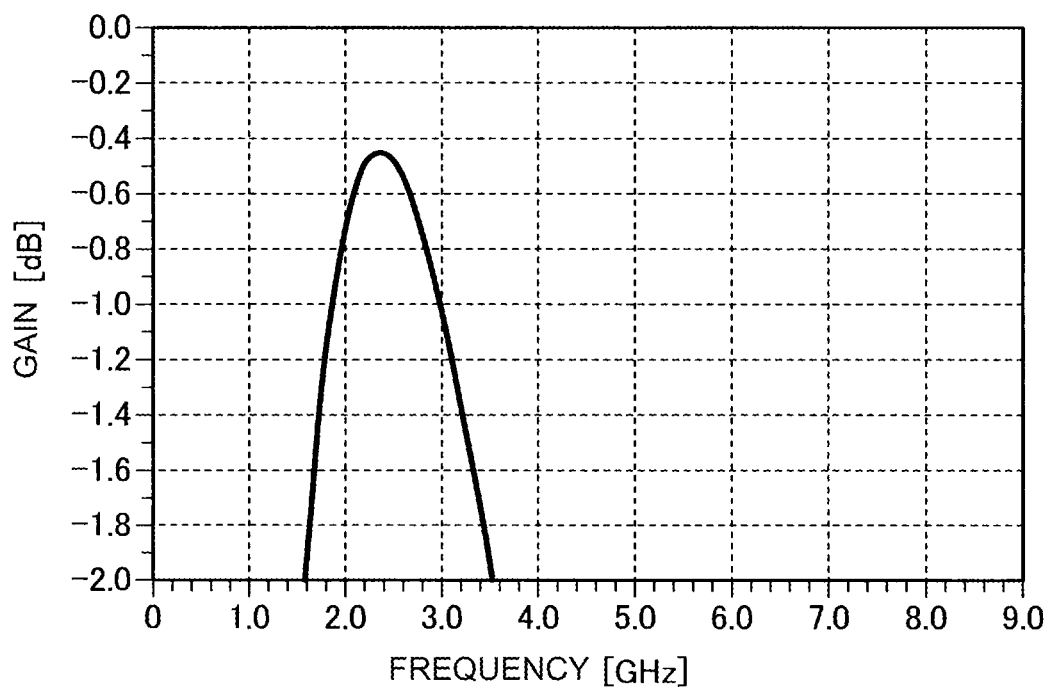
FIG. 13 is an enlarged view of a region of not less than −2.0 dB and not more than 0 dB in the simulation results of the frequency-gain characteristics illustrated in FIG. 12.
Figure 14:
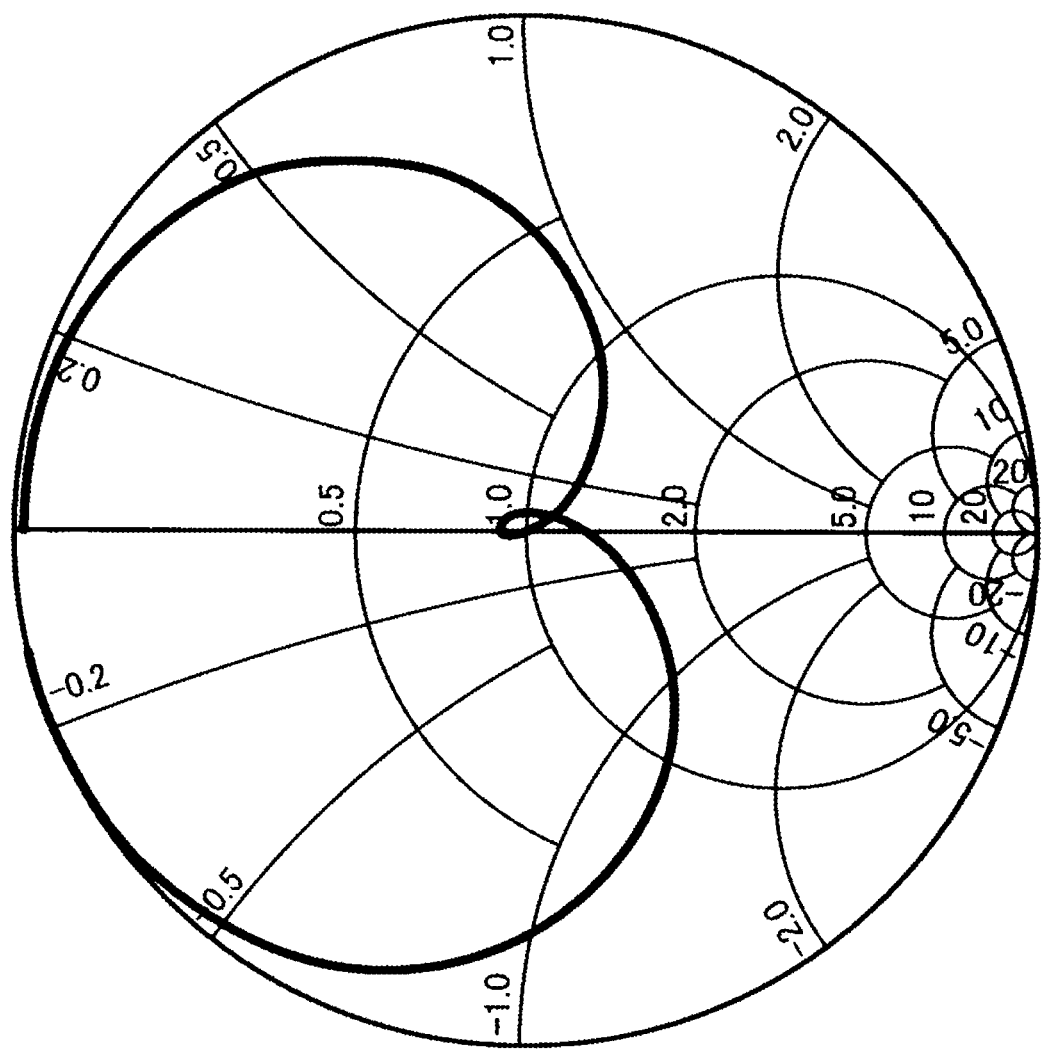
FIG. 14 is a Smith chart illustrating an example of simulation results of load characteristics in the case where the band pass filter illustrated in FIG. 11A is used in the power amplifier circuit according to the embodiment.

FIG. 12 illustrates an example of simulation results of frequency-gain characteristics in the case where the band pass filter illustrated in FIG. 11A is used in the power amplifier circuit according to the embodiment. FIG. 13 is an enlarged view of a region of not less than about −2.0 dB and not more than about 0 dB in the simulation results of the frequency-gain characteristics illustrated in FIG. 12. FIG. 14 is a Smith chart illustrating an example of simulation results of load characteristics in the case where the band pass filter illustrated in FIG. 11A is used in the power amplifier circuit according to the embodiment.

In the example illustrated in FIGS. 12 and 13, the horizontal axis represents frequency, and the vertical axis represents gain. Solid lines indicated in FIGS. 12 and 13 represent a bandpass characteristic from the node A to the node C in the configuration illustrated in FIGS. 11A and 11B.

A solid line indicated in FIG. 14 is a line obtained by plotting load characteristics of the BPF 8b illustrated in FIGS. 11A and 11B in a range of not less than about 10 MHz and not more than about 8.5 GHz.

Each of FIGS. 12, 13, and 14 illustrates results obtained by performing simulations when assuming that the capacitor C1 has a capacitance of about 19 pF, the capacitor C2 has a capacitance of about 3 pF, and the inductor L1 has an inductance of about 1 nH. The component values of the capacitors C1 and C2 and the inductor L1 are one example, and the present disclosure is not to be limited to the simulation results illustrated in each of FIGS. 12, 13, and 14.

In the above-described configuration, no series resonance exists in a shunt, the effect of suppressing a harmonic component thus decreases in comparison with the above-described first and second configuration examples, but loss for a fundamental component of a high-frequency signal decreases. In other words, broadband characteristics wider in bandwidth than those in the above-described first and second configuration examples can be obtained, and a component in a band lower than the band of a high-frequency signal (for example, in a low frequency band including about 100 MHz) can be kept from being superimposed on the output signal RFOUT due to distortion components of the two amplifier circuits 41 and 42 of the differential amplifier circuit 4.

Incidentally, the present disclosure is not limited to the BPF 8 of the first configuration example, the BPF 8a of the second configuration example, and the BPF 8b of the third configuration example that have been described above. In the output path of the output signal RFOUT, that is, between the other end (node A) of the output-side winding 62 and the output node 3 (node C), any BPF may be provided that keeps a component in a band lower than the band of a high-frequency signal (for example, in a low frequency band including about 100 MHz) from being superimposed on the output signal RFOUT due to distortion components of the two amplifier circuits 41 and 42 of the differential amplifier circuit 4 while suppressing a harmonic component of the high-frequency signal.

Figure 15A:
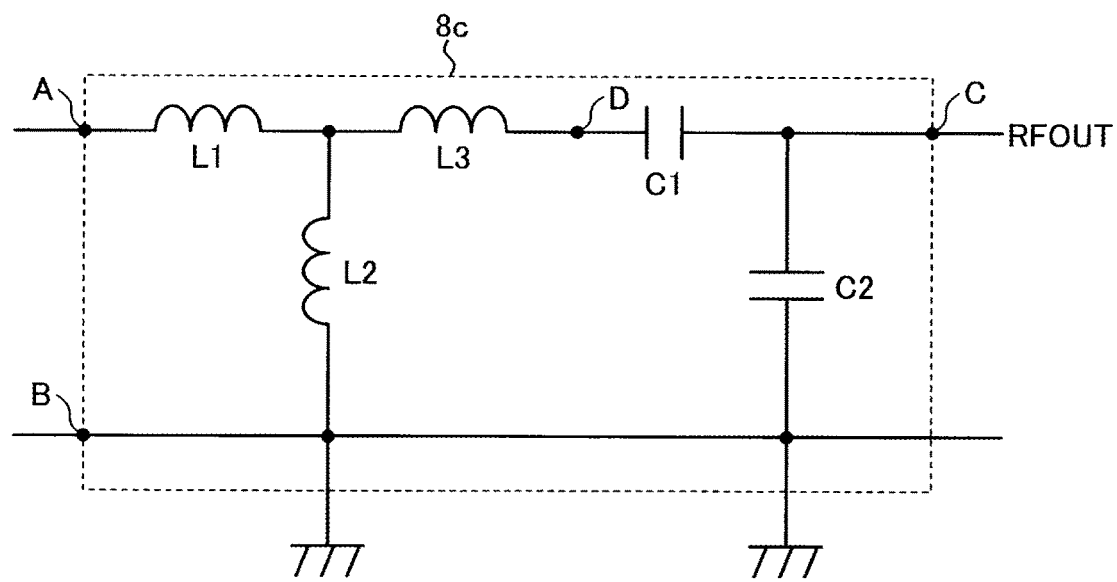
FIG. 15A illustrates another configuration example of the band pass filter (BPF)
Figure 15B:
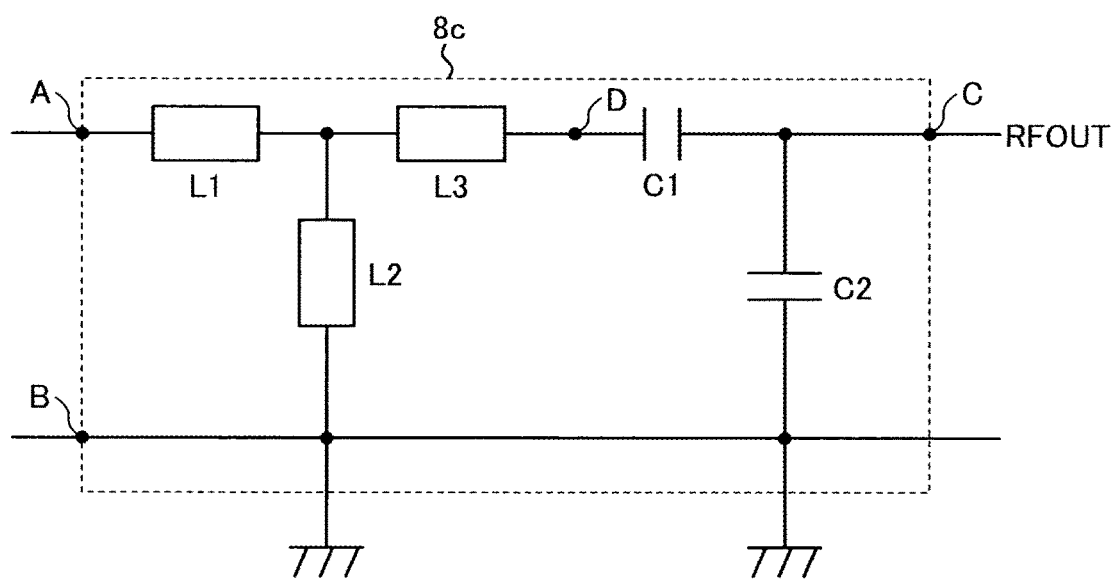
FIG. 15B illustrates a configuration in which an inductance illustrated in FIG. 15A is constituted by a microstrip line.

FIG. 15A illustrates another configuration example of the band pass filter (BPF). FIG. 15B illustrates a configuration in which an inductance illustrated in FIG. 15A is constituted by a microstrip line.

In the configuration illustrated in FIG. 15A, a BPF 8c includes the capacitors C1 and C2, which are capacitive elements, and inductors L1, L2, and L3, which are inductive elements. Incidentally, as illustrated in FIG. 15B, the inductors L1, L2, and L3 may be constituted by microstrip lines provided on a dielectric substrate (not illustrated).

In the BPF 8c of the other configuration example illustrated in FIGS. 15A and 15B, the inductors L1 and L3 are connected in series between the other end (node A) of the output-side winding 62 and a node D, and the inductor L2 is connected between a connection point between the inductors L1 and L3 and the reference potential (node B). Furthermore, the capacitor C1 is connected between the node D and the output node (node C), and the capacitor C2 is connected between the output node 3 (node C) and the reference potential (node B).

Thus, in the present disclosure, when the BPF 8, 8a, 8b, or 8c is provided in the output matching network 100 and appropriate component values are set, a component in a band lower than the band of a high-frequency signal (for example, in a low frequency band including about 100 MHz) can be kept from being superimposed on the output signal RFOUT due to distortion components of the two amplifier circuits 41 and 42 of the differential amplifier circuit 4 while suppressing a harmonic component of the high-frequency signal to be superimposed on the output signal RFOUT.

Incidentally, when a configuration is employed in which at least the capacitor C1 is included between the other end (node A) of the output-side winding 62 and the output node 3 (node C) in place of the BPFs 8, 8a, 8b, and 8c, a component in a band lower than the band of a high-frequency signal (for example, in a low frequency band including about 100 MHz) can be kept from being superimposed on the output signal RFOUT due to distortion components of the two amplifier circuits 41 and 42 of the differential amplifier circuit 4.

The above-described embodiment is intended to facilitate understanding of the present disclosure but is not intended for a limited interpretation of the present disclosure. The present disclosure can be changed or improved without departing from the gist thereof and encompasses equivalents thereof.

Furthermore, the present disclosure can take the following configurations.

(1) A power amplifier circuit according to one aspect of the present disclosure is a power amplifier circuit having an input node from which a high-frequency signal is inputted and an output node to which the high-frequency signal is amplified by a differential amplifier circuit to be outputted. The power amplifier circuit includes a balun transformer including an input-side winding that has a substantially center to which a power-supply voltage is supplied and that is connected between differential outputs of the differential amplifier circuit, and an output-side winding that is coupled to the input-side winding via an electromagnetic field and that has one end connected to a reference potential; and a capacitive element provided between another end of the output-side winding and the output node.

In this configuration, the capacitive element is provided in an output path of the high-frequency signal in the differential amplification-type power amplifier circuit, thereby making it possible to keep a frequency component lower in frequency than the high-frequency signal from being superimposed on an output signal due to a distortion component of the differential amplifier circuit.

(2) In the power amplifier circuit according to (1), a band pass filter including the capacitive element is formed between the other end of the output-side winding and the output node.

In this configuration, the band pass filter is provided in the output path of the high-frequency signal in the differential amplification-type power amplifier circuit, thereby making it possible to keep a frequency component lower in frequency than the high-frequency signal from being superimposed on an output signal due to a distortion component of the differential amplifier circuit while suppressing a harmonic component to be superimposed on the output signal to be outputted from the output node.

(3) In the power amplifier circuit according to (2), the band pass filter may include a first capacitive element, a second capacitive element, a first inductive element, and a second inductive element, the first capacitive element and the first inductive element may be connected in series between the other end of the output-side winding and the output node, and the second capacitive element and the second inductive element may be connected in series between the output node and the reference potential.

(4) In the power amplifier circuit according to (2), the band pass filter may include a first capacitive element, a second capacitive element, and an inductive element, the first capacitive element may be connected between the other end of the output-side winding and the output node, and the second capacitive element and the inductive element may be connected in series between the output node and the reference potential.

(5) In the power amplifier circuit according to (2), the band pass filter may include a first capacitive element, a second capacitive element, and an inductive element, the first capacitive element and the inductive element may be connected in series between the other end of the output-side winding and the output node, and the second capacitive element may be connected between the output node and the reference potential.

(6) In the power amplifier circuit according to any of (1) to (5), the differential amplifier circuit performs power amplification by using an envelope tracking scheme.

In this configuration, the band pass filter is provided in the output path of the high-frequency signal, thereby making it possible to keep a frequency component in an envelope band from being superimposed on an output signal due to a distortion component of the differential amplifier circuit while suppressing a harmonic component to be superimposed on the output signal to be outputted from the output node.

The present disclosure makes it possible, in the differential amplification-type power amplifier circuit, to keep a frequency component lower in frequency than a high-frequency signal from being superimposed on an output signal due to a distortion component of the differential amplifier circuit.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. A power amplifier circuit having an input node to which a high-frequency signal is input and an output node from which an amplified high-frequency signal is output, the high-frequency signal being amplified by a differential amplifier circuit, the power amplifier circuit comprising:
   a balun transformer comprising an input-side winding that is connected between differential outputs of the differential amplifier circuit, and an output-side winding that is coupled to the input-side winding via an electromagnetic field and that has a first end connected to a reference potential;
   a capacitive element between a second end of the output-side winding and the output node; and
   a band pass filter between the second end of the output-side winding and the output node, the band pass filter comprising the capacitive element,
   wherein the input-side winding has a substantially centered tap, and
   wherein a power-supply voltage is supplied to the substantially centered tap.

2. The power amplifier circuit according to claim 1, wherein the band pass filter further comprises:
   a second capacitive element, a first inductive element, and a second inductive element,
   wherein the capacitive element and the first inductive element are connected in series between the second end of the output-side winding and the output node, and
   wherein the second capacitive element and the second inductive element are connected in series between the output node and the reference potential.

3. The power amplifier circuit according to claim 1, wherein the band pass filter further comprises:
   a second capacitive element, and an inductive element,
   wherein the capacitive element is connected between the second end of the output-side winding and the output node, and
   wherein the second capacitive element and the inductive element are connected in series between the output node and the reference potential.

4. The power amplifier circuit according to claim 1, wherein the band pass filter further comprises:
   a second capacitive element, and an inductive element,
   wherein the capacitive element and the inductive element are connected in series between the second end of the output-side winding and the output node, and
   wherein the second capacitive element is connected between the output node and the reference potential.

5. The power amplifier circuit according to claim 1, wherein the band pass filter further comprises:
   a second capacitive element, a first inductive element, a second inductive element, and a third inductive element,
   wherein the first inductive element, the third inductive element, and the capacitive element are connected in series between the second end of the output-side winding and the output node,
   wherein the second inductive element is connected between the reference potential and a node between the first and third inductive elements, and
   wherein the second capacitive element is connected between the output node and the reference potential.

6. The power amplifier circuit according to claim 1, wherein the differential amplifier circuit is configured to amplify the high-frequency signal according to an envelope tracking scheme.

7. The power amplifier circuit according to claim 2, wherein the differential amplifier circuit is configured to amplify the high-frequency signal according to an envelope tracking scheme.

8. The power amplifier circuit according to claim 3, wherein the differential amplifier circuit is configured to amplify the high-frequency signal according to an envelope tracking scheme.

9. The power amplifier circuit according to claim 4, wherein the differential amplifier circuit is configured to amplify the high-frequency signal according to an envelope tracking scheme.

10. The power amplifier circuit according to claim 5, wherein the differential amplifier circuit is configured to amplify the high-frequency signal according to an envelope tracking scheme.

* * * * *

UNITED STATES PATENT AND TRADEMARK OFFICE
CERTIFICATE OF CORRECTION

PATENT NO. : 11,817,837 B2
APPLICATION NO. : 17/129041
DATED : November 14, 2023
INVENTOR(S) : Yuri Honda et al.

It is certified that error appears in the above-identified patent and that said Letters Patent is hereby corrected as shown below:

In the Specification

Column 9, Line 23, "output node (node C)," should be -- output node 3 (node C) --.

Signed and Sealed this
Sixth Day of August, 2024

Katherine Kelly Vidal
*Director of the United States Patent and Trademark Office*